United States Patent
Wang et al.

(10) Patent No.: US 12,196,799 B1
(45) Date of Patent: Jan. 14, 2025

(54) METHOD AND APPARATUS FOR OPTIMIZING AND TESTING HARNESS LAYOUT OF BATTERY SWAPPING ELECTRICAL INTERFACE

(71) Applicant: CATARC NEW ENERGY VEHICLE TEST CENTER (TIANJIN) CO., LTD., Tianjin (CN)

(72) Inventors: Fang Wang, Tianjin (CN); Baoqiang Zhang, Tianjin (CN); Bin Fan, Tianjin (CN); Tianlei Zheng, Tianjin (CN); Dongdong Cao, Tianjin (CN); Jiaojiao Wang, Tianjin (CN); He Chen, Tianjin (CN); Yanwan Gao, Tianjin (CN); Zizhang Xue, Tianjin (CN); Yue Xu, Tianjin (CN); Shaohui Liu, Tianjin (CN)

(73) Assignee: CATARC NEW ENERGY VEHICLE TEST CENTER (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 18/419,324

(22) Filed: Jan. 22, 2024

(30) Foreign Application Priority Data

Sep. 28, 2023 (CN) .......................... 202311264093.4

(51) Int. Cl.
*G01R 31/00* (2006.01)
*B60R 16/02* (2006.01)
*B60L 53/80* (2019.01)

(52) U.S. Cl.
CPC ........ *G01R 31/006* (2013.01); *B60R 16/0215* (2013.01); *B60L 53/80* (2019.02)

(58) Field of Classification Search
CPC .... G01R 31/006; B60R 16/0215; B60L 53/80
See application file for complete search history.

(56) References Cited

U.S. PATENT DOCUMENTS

| 2013/0184890 A1 | 7/2013 | Li et al. |
| 2022/0036330 A1* | 2/2022 | Ong ................... G06Q 30/0645 |

FOREIGN PATENT DOCUMENTS

| CN | 103460522 A | 12/2013 |
| CN | 105021217 A | 11/2015 |

(Continued)

OTHER PUBLICATIONS

First Office Action issued in counterpart Chinese Patent Application No. 202311264093.4, dated Nov. 10, 2023.

(Continued)

*Primary Examiner* — Jay Patidar
(74) *Attorney, Agent, or Firm* — Westbridge IP LLC

(57) ABSTRACT

Disclosed are a method and an apparatus for optimizing and testing a harness layout of a battery swapping electrical interface. The method includes: obtaining a first distance, a second distance and initial floating data of the battery swapping electrical interface; adjusting the first distance and the second distance to obtain first floating data of the battery swapping electrical interface again; repeatedly inserting or pulling the plug into or out of the socket of the battery swapping electrical interface; obtaining second floating data of the battery swapping electrical interface after repeatedly inserting or pulling the plug into or out of the socket for a preset number of times; and determining the current first distance and second distance as optimal distances if it is judged that the second floating data is in the second index interval.

4 Claims, 3 Drawing Sheets

(56) References Cited

FOREIGN PATENT DOCUMENTS

| | | | |
|---|---|---|---|
| CN | 109902324 | A | 6/2019 |
| CN | 111366346 | A | 7/2020 |
| CN | 112393864 | A | 2/2021 |
| CN | 112645149 | A | 4/2021 |
| CN | 214479187 | U | 10/2021 |
| CN | 114503376 | A | 5/2022 |
| JP | 2003092451 | A | 3/2003 |

OTHER PUBLICATIONS

Qin et al., Railway engineering site laboratory inspection and acceptance shallow talk, Railway Engineering, 2006, 12, pp. 105-106, dated Dec. 31, 2006.

\* cited by examiner

METHOD AND APPARATUS FOR OPTIMIZING AND TESTING HARNESS LAYOUT OF BATTERY SWAPPING ELECTRICAL INTERFACE

CROSS-REFERENCE OF RELATED APPLICATIONS

This application claims priority to China Patent Application No. 202311264093.4, titled "Method and Apparatus for Optimizing and Testing Harness Layout of Battery Swapping Electrical Interface", filed on Sep. 28, 2023 in the China National Intellectual Property Administration (CNIPA), which is hereby incorporated by reference in its entirety.

TECHNICAL FIELD

The present application generally relates to the technical field of vehicle harness fixation, and in particular to a method and an apparatus for optimizing and testing a harness layout of a battery swapping electrical interface.

BACKGROUND

A harness refers to a component of the connecting circuit, that is formed by pressing a contact terminal (connector) made of a copper material, a wire and a cable, then plastic pressing an insulator outside or adding a metal shell outside, and bundling them by wires. Most of traditional harness layouts are to directly bundle or mount the harnesses in spaces formed between vehicle components to more rationalize overall layouts of vehicles. However, during long-time working and traveling of the vehicle, an automobile component is always in a vibration environment; accordingly, the harness will also shake to a certain degree; and the harness is prone to producing friction with its adjacent automobile component.

Patent No. CN204118617U "Harness Fixing Apparatus and Automobile" discloses a harness fixing apparatus, which is used to regulate a gas path of a pipeline and a harness that are arranged in the vehicle, and better protects them at the same time. However, a mounting position of the harness fixing apparatus is not stated. If it is applied to a harness of a power battery of an electric vehicle, a position of the harness fixing apparatus relative to the battery swapping electrical interface may directly affect the inserting or pulling requirement and the service life of the battery swapping electrical interface. Therefore, a method and an apparatus for optimizing and testing a harness layout of a battery swapping electrical interface is proposed for solving the above problems.

SUMMARY

In view of the defects or the disadvantages in the prior art, it is expected to provide a method and an apparatus for optimizing and testing a harness layout of a battery swapping electrical interface which more reasonably arranges a position for a harness, and prolongs the service life of the battery swapping electrical interface.

In a first aspect, the present application provides a method for optimizing and testing a harness layout of a battery swapping electrical interface, implemented based on an apparatus for optimizing and testing a harness layout, including: a first platform and a second platform arranged at a bottom of the first platform, where the first platform is provided with at least one test station, on which a socket of the battery swapping electrical interface is mounted; the second platform is further provided with a movable supporting arm; and the supporting arm is further provided with a movable harness fixing piece used for fixing a harness of the socket.

The method for optimizing and testing the harness layout comprises the following steps:
obtaining a first distance, a second distance and initial floating data of the battery swapping electrical interface, where the first distance is a linear distance between an extension line passing through a center of the socket and a central axis of the supporting arm, the second distance is a linear distance between the harness fixing piece and a surface of the second platform, and the initial floating data includes, but not limited to: an X-direction initial floating index, an Y-direction initial floating index, a Z-direction initial floating index and an initial floating angle compensation index;
adjusting the first distance and the second distance to obtain first floating data of the battery swapping electrical interface again if it is judged that the initial floating data is in a first index interval;
repeatedly inserting or pulling the plug into or out of the socket of the battery swapping electrical interface if it is judged that the first floating data is not present in the first index interval or a second index interval, where the first index interval is larger than the second index interval;
obtaining second floating data of the battery swapping electrical interface after repeatedly inserting or pulling the plug into or out of the socket for a preset number of times; and
determining the current first distance and second distance as optimal distances if it is judged that the second floating data is in the second index interval.

In a second aspect, the present application provides an apparatus for optimizing and testing a harness layout of a battery swapping electrical interface, implementing the method for optimizing and testing the harness layout of the battery swapping electrical interface, including:
a first platform which is provided with at least one test station, and on which a socket of a to-be-tested battery swapping electrical interface is mounted;
a second platform which is arranged at a bottom of the first platform, where a first graduated scale in a length direction of the second platform is arranged on a side wall of the second platform;
a supporting arm which is movably arranged on the second platform, perpendicular to a surface of the second platform and provided with a second graduated scale, where the second graduated scale is mutually perpendicular to the first graduated scale;
a harness fixing piece which is movably arranged on the supporting arm, and used for fixing a harness of the socket; and
a driving unit which has at least two driving ends, where the driving ends are connected with the supporting arm and the harness fixing piece respectively,
the corresponding supporting arm and harness fixing piece are driven by the driving ends of the driving unit to move, which changes a linear distance between the supporting arm and an extension line passing through a center of the socket, and a linear distance between the harness fixing piece and a surface of the second platform.

To sum up, the present application discloses a specific flow of the method for optimizing and testing the harness layout of the battery swapping electrical interface. The present application includes the following steps: obtaining initial floating data of a first distance, a second distance and a battery swapping electrical interface; adjusting the first distance and the second distance to obtain first floating data of the battery swapping electrical interface again if it is judged that the initial floating data is in a first index interval; repeatedly inserting or pulling a plug into or out of a socket of the battery swapping electrical interface if it is judged that the first floating data is not present in the first index interval or a second index interval; obtaining second floating data of the battery swapping electrical interface after repeatedly inserting or pulling the plug into or out of the socket for a preset number of times; and determining the current first distance and second distance as optimal distances if it is judged that the second floating data is in the second index interval.

The present application continuously adjusts the first distance and the second distance by combining static and dynamic tests, so that the floating data can be in the second index interval, that is, in a case that the harness fixing piece minimally affects a floating capacity of the socket, the corresponding first distance and second distance are the optimal distances; and then, according to the optimal distances, the position of the harness fixing piece on a real vehicle is arranged, so that the battery swapping electrical interface meets the inserting or pulling requirement, and the mounting position of the harness fixing piece is prevented from affecting the socket itself at the same time, which effectively prolongs the service life of the battery swapping electrical interface.

BRIEF DESCRIPTION OF THE DRAWINGS

Other features, objectives and advantages of the present application will become more apparent by reading the detailed description of non-limiting embodiments made with reference to the following accompanying drawings.

DETAILED DESCRIPTION OF THE EMBODIMENTS

Figure 1:
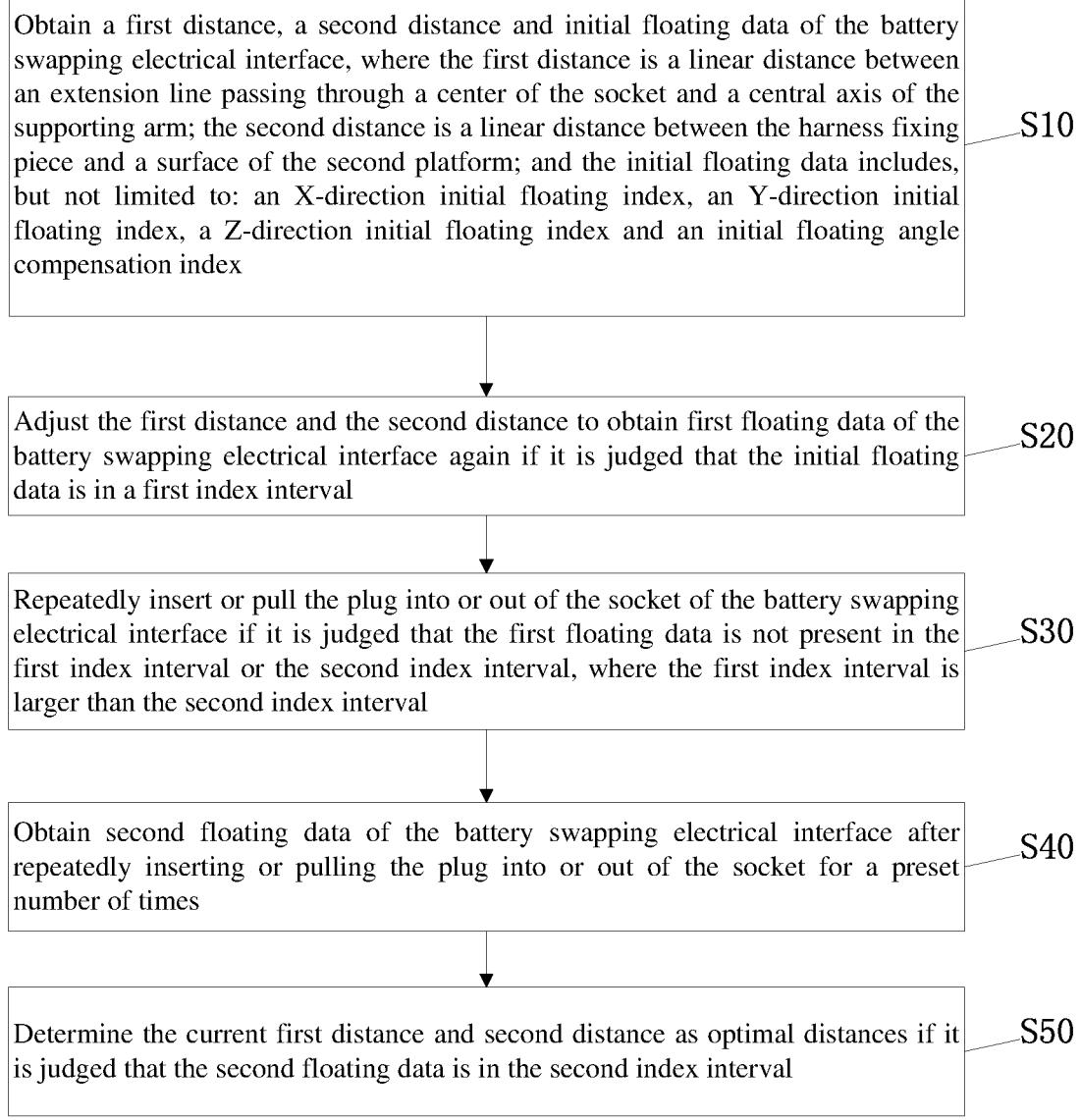
FIG. 1 is a flow chart of a method for optimizing and testing a harness layout of a battery swapping electrical interface.

The present application is further described in detail below with reference to the accompanying drawings and embodiments. It can be understood that the specific embodiments described here are only used to explain the related application, but not to limit the present application. In addition, it needs to be noted that, for the convenience of description, only the parts related to the application are shown in the drawings.

It is to be noted that the embodiments and features in the embodiments of the present application may be combined with each other without conflict. The present application will be described below in detail with reference to the accompanying drawings and in conjunction with the embodiments.

In the present application, a battery swapping electrical interface 01 can also be called a battery swap connector. The battery swap connector includes a socket 1 and a plug 2. In an overall vehicle 13, the plug 2 is mounted in a battery system for battery swapping, to be used for being connected with an electrical interface of the vehicle together; and the socket 1 is mounted in a battery swapping base, to be used for being connected with the battery system for battery swapping together. A harness 8 is connected to the socket 1. A position of a fixed position (fixed by a harness fixing piece 7) of the harness 8 on a chassis 131 of the overall vehicle relative to the electrical interface 01 (for example, a distance between the harness fixing piece 7 and the socket 1, or a distance between the harness fixing piece 7 and the frame 131a of the overall vehicle) may directly affect the inserting or pulling requirement and the service life of the battery swapping electrical interface 01. In this case, a corresponding test method and test device are set based on optimization on a harness layout of the battery swapping electrical interface 01 in the overall vehicle 13.

Figure 5:
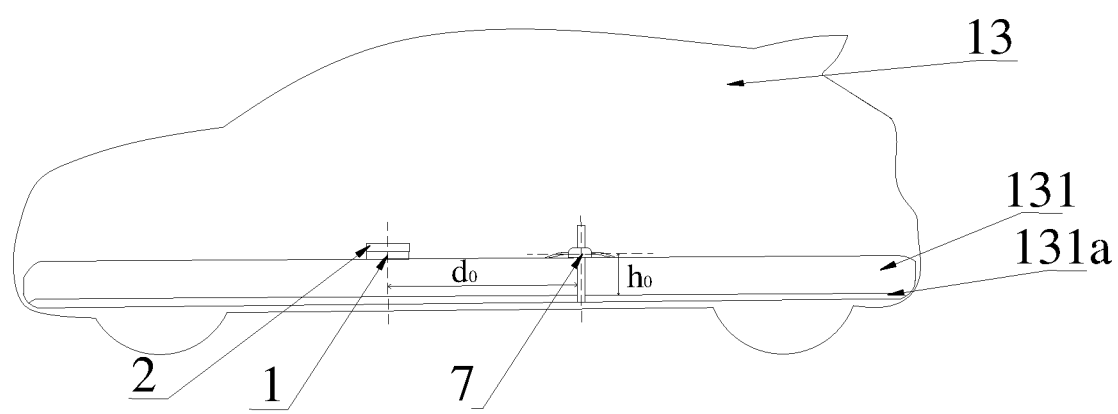
FIG. 5 is a schematic structural diagram of an overall vehicle.

In addition, it needs to be noted that, as shown in FIG. 5, the frame 131a of the overall vehicle in this case is a structure located in the chassis 131 of the overall vehicle.

Embodiment 1

Figures 2, 3:
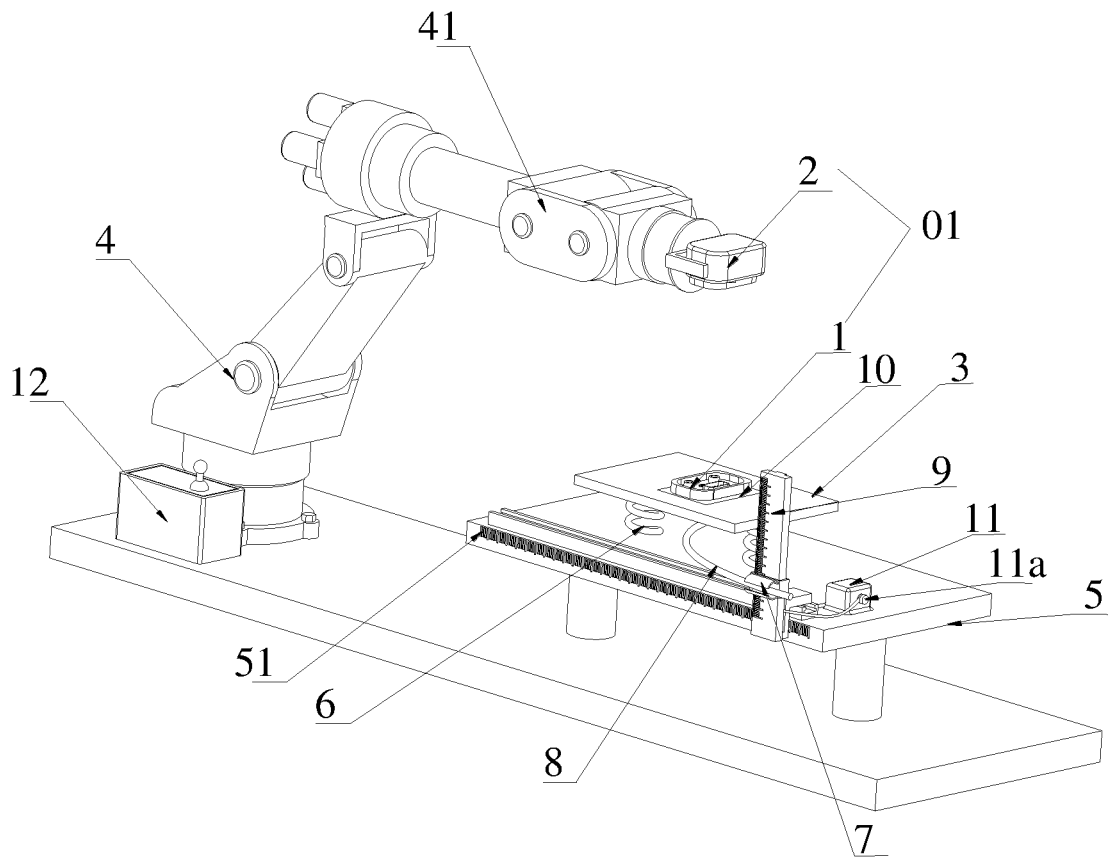
FIG. 2 is a flow chart of reproducing mounting parameters of an overall vehicle.
FIG. 3 is a schematic structural diagram of an apparatus for optimizing and testing a harness layout of a battery swapping electrical interface.
Figure 4:
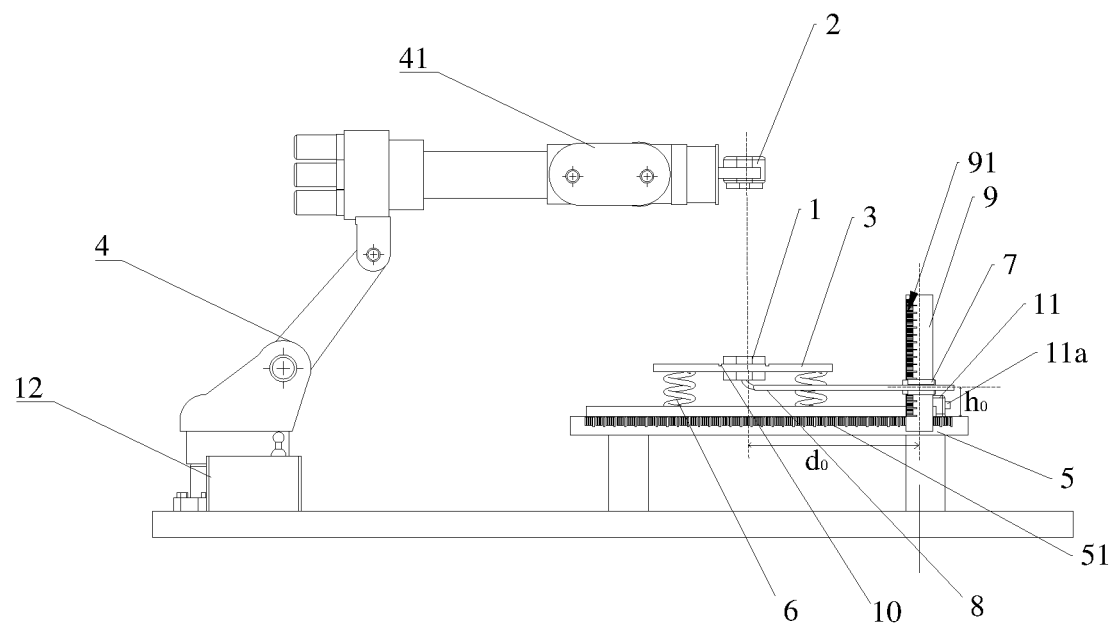
FIG. 4 is a schematic structural diagram of an apparatus for optimizing and testing a harness layout of a battery swapping electrical interface in another direction.

Referring to a method for optimizing and testing a harness layout of a battery swapping electrical interface (as shown in FIG. 1), implemented based on an apparatus for optimizing and testing a harness layout, as shown in FIG. 3 and FIG. 4, the apparatus for optimizing and testing the harness layout includes: a first platform 3 and a second platform 5 arranged at a bottom of the first platform 3; the first platform 3 is provided with at least one test station 10, on which a socket 1 of the battery swapping electrical interface 01 is mounted; the second platform 5 is further provided with a movable supporting arm 9; and the supporting arm 9 is further provided with a movable harness fixing piece 7 used for fixing a harness 8 of the socket 1, where the first platform 3 and the second platform 5 are used for simulating the chassis 131 of the overall vehicle, and the second platform 5 is used for simulating the frame 131a of the overall vehicle.

As shown in FIG. 1, the method for optimizing and testing the harness layout includes the following steps:

S10, obtaining a first distance, a second distance and initial floating data of the battery swapping electrical interface 01, where the first distance is a linear distance between an extension line (i.e. a central axis of the socket 1) passing through a center of the socket in 1 and a central axis of the supporting arm 9; the second distance is a linear distance between the harness fixing piece 7 and a surface of the second platform 5; and the initial floating data includes, but not limited to: an X-direction initial floating index, an Y-direction initial floating index, a Z-direction initial floating index and an initial floating angle compensation index.

Here, the initial floating data refers to floating data, obtained in an initial state, of the battery swapping electrical interface 01. Also, it is set that: a length direction of the socket 1 is an X direction, a width direction of the socket 1 is an Y direction, and a height direction of the socket 1 is a Z direction. The above indexes are named according to set directions.

The initial state refers to that the mounting parameters are initially reproduced on the apparatus for optimizing and testing the harness layout, and the socket 1 is completely separated from the plug 2 without plugging, where $d_0$ in FIG. 4 or 5 represents the first distance in the initial state, and also the linear distance between the extension line passing through the center of the socket 1 and the extension line passing through the center of the harness fixing piece 7 of the chassis 131 of the overall vehicle; and $h_0$ in FIG. 4 or 5 represents the second distance in the initial state, and also the linear distance between the extension line passing through the center of the harness fixing piece 7 of the chassis 131 of the overall vehicle and the top of the frame 131a of the overall vehicle.

Specifically, the obtaining initial floating data of the battery swapping electrical interface 01 includes the following steps:

obtaining an offset distance of the plug 2 relative to the socket 1 on the premise that the plug 2 can be plugged into the socket 1, where the offset distance is the initial floating data of the current battery swapping electrical interface 01.

For example, In any degree of freedom, the offset distance of the plug 2 relative to the socket 1 is 5 mm, that is, the initial floating data of the current battery swapping electrical interface 01 is 5 mm.

Here, the offset distance may be obtained from the control module 12 which controls a manipulator to move, where the control module 12 is of a type of, for example, an upper machine which is in communication connection with the manipulator. Before a test, staff may input a plurality of offset distances into the upper machine. During the test, the upper machine sends a first control command that is the offset distance formed by driving the plug 2 by the manipulator to move relative to the socket 1; and then, the plug 2 is plugged into the socket 1. If the plug 2 can be plugged into the socket 1, the current offset distance is the initial floating data of the current battery swapping electrical interface 01.

Assuming: in a case that a central axis of the socket 1 coincides with that of the plug 2, the offset distance of the battery swapping electrical interface 01 is 0; and the plug 2 is gradually offset outward relative to the socket 1 by 3 mm, 4 mm, 5 mm and 6 mm separately from the position where the central axis of the socket 1 coincides with that of the plug 2. If the offset distance of the battery swapping electrical interface 01 is 5 mm, the plug 2 can be plugged into the socket 1, and then, the current offset distance is the initial floating data of the current battery swapping electrical interface 01. If the offset distance of the battery swapping electrical interface 01 is 6 mm, the plug 2 can not be plugged into the socket 1, and then, the offset distance of 5 mm is the initial floating data of the current battery swapping electrical interface 01.

Further, as shown in FIG. 2, before obtaining a first distance and a second distance, the method further includes the following steps:

S1, collecting mounting parameters of the battery swapping electrical interface 01 on an overall vehicle 13, where the mounting parameters at least include: a linear distance between the extension line passing through the center of the socket 1 and an extension line passing through a center of the harness fixing piece 7 of a chassis 131 of the overall vehicle, and a linear distance between the extension line passing through the center of the harness fixing piece 7 of the chassis 131 of the overall vehicle and a top of a frame 131a of the overall vehicle; and S2, mounting, according to the mounting parameters, the supporting arm 9 and the harness fixing piece 7 in corresponding positions on the second platform 5.

By collecting actual mounting parameters of the battery swapping electrical interface 01 on the overall vehicle 13, they are reproduced on the apparatus for optimizing and testing the harness layout, making subsequently obtained distance data more meet the actual demand.

S20, Adjusting the first distance and the second distance to obtain first floating data of the battery swapping electrical interface 01 again if it is judged that the initial floating data is in a first index interval, where the first floating data and the initial floating data are of a same source, which will not be repeated here.

Since the position of the harness fixing piece 7 relative to the battery swapping electrical interface 01 may directly affect a floating capacity of the socket 1 of the battery swapping electrical interface 01, after the first distance and the second distance change, it is necessary to obtain the floating data (i.e. the first floating data) of the battery swapping electrical interface 01 again.

If the obtained first floating data is in a second index interval, the current first distance and second distance are the optimal distances. The position of the harness fixing piece 7 may be arranged on the real vehicle according to the optimal distances; and at this time, the harness fixing piece 7 minimally affects the inserting or pulling requirement and the service life of the battery swapping electrical interface 01.

For convenience in description of various index intervals, data and letters in Table 1 are used.

TABLE 1

| Floating Ranges in Various Degrees of Freedom | | | | |
|---|---|---|---|---|
| Floating range | i | j | m | n |
| Floating indexes in various degrees of freedom | | | | |
| u | $x \leq X_0/2$ | $y \leq Y_0/2$ | $z \leq Z_0/2$ | $0 \leq \Phi_0/2$ |
| v | $X_0/2 < x \leq X_0$ | $Y_0/2 < y \leq Y_0$ | $Z_0/2 < z \leq Z_0$ | $\Phi_0/2 < \theta \leq \Phi_0$ |
| w | $x > X_0$ | $y > Y_0$ | $z > Z_0$ | $\theta > \Phi_0$ |

In Table 1, i represents the X-direction floating index; j represents the Y-direction floating index; m represents the Z-direction floating index; n represents a floating angle compensation index; u represents a first-level floating range of the floating index in each degree of freedom; v represents a second-level floating range of the floating index in each degree of freedom; and w represents a third-level floating range of the floating index in each degree of freedom. x represents an actually collected X-direction floating index; $X_0$ represents an X-direction maximal floating quantity of the socket 1 of the battery swapping electrical interface 01; y represents an actually collected Y-direction floating index; $Y_0$ represents an Y-direction maximal floating quantity of the socket 1 of the battery swapping electrical interface 01; z represents an actually collected Z-direction floating index; $Z_0$ represents a Z-direction maximal floating quantity of the socket 1 of the battery swapping electrical interface 01; θ represents an actually collected floating angle compensation index; $\Phi_0$ represents a maximal floating angle compensation value of the socket 1 of the battery swapping electrical interface 01; and $X_0/2$, $Y_0/2$, $Z_0/2$ and $\Phi_0/2$ are set by those skilled in the art by experience.

Here, the first index interval is, for example, (w, i)∪(w, j)∪(w, m)∪(w, n); for example, (w, i) represents a third-level floating range of the X-direction floating index, i.e. $x>X_0$.

Further, the adjusting the first distance and a second distance specifically includes the following steps:
individually adjusting the first distance or the second distance according to a preset step length,
where the preset step length is, for example, 1 cm, and may be adjusted as actually needed.

When the first distance and the second distance are adjusted, one of them is adjusted first, and the other distance is unchanged. For example, in a case that the first distance is adjusted according to the preset step length, and the second distance remains unchanged, each time the first distance is adjusted according to the preset step length, floating data needs to be collected; when the floating data corresponding to a certain adjusted first distance is in the second index interval, the current first distance is the optimal distance; and then, the current first distance remains unchanged, and the second distance is adjusted according to the preset step length. Similarly, when the floating data corresponding to a certain adjusted second distance is in the second index interval, the current second distance is the optimal distance. By debugging one by one, the optimal distances are finally obtained. In the apparatus for optimizing and testing the harness layout, a final position of the harness fixing piece 7 is a position adjusted by the optimal distances, and a harness fixed point of the harness fixing piece 7 is on the central axis of the supporting arm 9, where the harness fixed point is a fixed point of the harness 8. Then, the optimal distances are used to arrange the position of the harness fixing piece 7 on the real vehicle, so that the positions of the harness 8 and the harness fixing piece 7 are reasonably arranged, and the service life of the battery swapping electrical interface 01 can also be effectively prolonged.

S30, Repeatedly inserting or pulling the plug 2 into or out of the socket 1 of the battery swapping electrical interface 01 if it is judged that the first floating data is not present in the first index interval or the second index interval, where the first index interval is larger than the second index interval.

Here, the second index interval is, for example, (u, i)∪(u, j)∪(u, m)∪(u, n); for example, (u, i) represents a first-level floating range of the X-direction floating index, i.e. $x \leq X_0/2$, where that the first floating data is not present in the first index interval or the second index interval refers to that except the first index interval or the second index interval, the first floating data falls in any interval freely combined by the floating ranges in various degrees of freedom in Table 1.

Before the plug 2 is inserted or pulled into and from the socket 1, it is necessary to keep the plug 2 parallel to the first platform 3.

S40, Obtaining second floating data of the battery swapping electrical interface 01 after repeatedly inserting or pulling the plug 2 into or out of the socket 1 for a preset number of times, where the preset number of times is, for example, 1000 times. The second floating data and the initial floating data are of a same source, which will not be repeated here.

S50, Determining the current first distance and second distance as optimal distances if it is judged that the second floating data is in the second index interval.

The optimal distances are used to arrange the position of the harness fixing piece 7 on the real vehicle, so that the positions of the harness 8 and the harness fixing piece 7 are reasonably arranged, and the service life of the battery swapping electrical interface 01 can also be effectively prolonged.

If the second floating data is in the first index interval, step S30 is executed; and if the second floating data is not present in the first index interval or the second index interval, step S40 is executed.

The present application continuously adjusts the first distance and the second distance by combining static and dynamic tests, so that the floating data can be in the second index interval. Specifically, the static test refers to that when in the initial state, the socket 1 is completely separated from the plug 2, and the initial floating data is judged. If the initial floating data is in the first index interval, the first distance and the second distance are adjusted, that is, the relative positions between the harness fixing piece 7 and the socket 1 are changed, and the first floating data is obtained again. If the first floating data is in the second index interval, the current first distance and second distance are the optimal distances, and there is no need for a subsequent dynamic test. If the first floating data is not present in the first index interval or the second index interval, the steps of the dynamic test are executed. Specifically, the dynamic test refers to repeatedly inserting or pulling the plug 2 into or out of the socket 1, and then obtaining the second floating data after repeating for the preset number of times. If it is judged that the second floating data is in the second index interval, the current first distance and second distance are determined as the optimal distances. According to the optimal distances, the position of the harness fixing piece on the real vehicle is arranged, so that the battery swapping electrical interface 01 meets the inserting or pulling requirement, and the mounting position of the harness fixing piece is prevented from affecting the socket itself at the same time, which effectively prolongs the service life of the battery swapping electrical interface 01.

Embodiment 2

As shown in FIG. 3, the present application further provides an apparatus for optimizing and testing a harness layout of a battery swapping electrical interface, capable of implementing the method for optimizing and testing the harness layout of the battery swapping electrical interface in embodiment 1. The apparatus for optimizing and testing the harness layout includes:

a first platform 3 which is provided with at least one test station 10, and on which a socket 1 of a to-be-tested battery swapping electrical interface 01 is mounted;

a second platform 5 which is arranged at a bottom of the first platform 3, where a first graduated scale 51 in a length direction of the second platform 5 is arranged on a side wall of the second platform 5;

a supporting arm 9 which is movably arranged on the second platform 5, perpendicular to a surface of the second platform 5 and provided with a second graduated scale 91, where the second graduated scale 91 is mutually perpendicular to the first graduated scale 51, and the supporting arm 9 can move in the length direction of the second platform 5;

a harness fixing piece 7 which is movably arranged on the supporting arm 9, and used for fixing a harness 8 of the socket 1; and a driving unit 11 which has at least two driving ends 11a, where the driving ends 11a are connected with the supporting arm 9 and the harness fixing piece 7 respectively, The corresponding supporting arm 9 and harness fixing piece 7 are driven by the driving ends 11a of the driving unit 11 to move, which changes a linear distance between the supporting arm 9 and an extension line passing through a center of the socket 1, and a linear distance between the harness fixing piece 7 and a surface of the second platform 5.

The driving unit 11 is of a specific structure consisting of, for example, two driving motors; the driving end 11a of one driving motor is connected with the supporting arm 9, to be used for driving the supporting arm 9 to move along the second platform 5, thereby changing the linear distance between the supporting arm 9 and the extension line passing through the center of the socket 1; and the driving end 11a of the other driving motor is connected with the harness fixing piece 7, to be used for driving the harness fixing piece 7 to move, thereby changing the linear distance between the harness fixing piece 7 and the surface of the second platform 5.

Further, the apparatus further includes: a manipulator 4, where the manipulator 4 is adjacent to the second platform 5, and has at least one clamping end 41 used for clamping the plug 2 of the to-be-tested battery swapping electrical interface 01; and the manipulator 4 can change the position of the plug 2 relative to the socket 1 in six degrees of freedom.

The manipulator 4 further has a control module 12 electrically connected with the clamping end 41, where the control module 12 is used for controlling the clamping end 41 to drive the plug 2 to move, which changes relative positions of the plug 2 to the socket 1.

Here, the control module 12 is of a model of, for example, Siemens S7-1200.

Further, an elastic support 6 is arranged between the first platform 3 and the second platform 5, where the elastic support 6 is used for simulating a spring between a socket tray of the battery swapping electrical interface and the battery swapping electrical interface. If there is no spring between the socket tray of the battery swapping electrical interface and the battery swapping electrical interface on the real overall vehicle, there is no elastic support 6 between the first platform 3 and the second platform 5; or a rigid strut is arranged between the first platform 3 and the second platform 5.

Described above are only preferred embodiments of the present application and descriptions of the applied technical principles. Those skilled in the art should understand that, the application scope referred to in the present application is not limited to the technical solutions formed by specific combinations of the technical features, but should also cover other technical solutions formed by any combination of the technical features or equivalent features without departing from the application concept. For example, technical solutions formed by replacing the features with (but not limited to) technical features with similar functions in the present application are included.

What is claimed is:

1. A method for optimizing and testing a harness layout of a battery swapping electrical interface, implemented based on an apparatus for optimizing and testing a harness layout, comprising: a first platform and a second platform arranged at a bottom of the first platform; wherein the first platform is provided with at least one test station, on which a socket of the battery swapping electrical interface is mounted; the second platform is further provided with a movable supporting arm; and the supporting arm is further provided with a movable harness fixing piece used for fixing a harness of the socket; and the method for optimizing and testing the harness layout comprises the following steps:

obtaining a first distance, a second distance and initial floating data of the battery swapping electrical interface, wherein the first distance is a linear distance between an extension line passing through a center of the socket and a central axis of the supporting arm, the second distance is a linear distance between the harness fixing piece and a surface of the second platform, the initial floating data comprises: an X-direction initial floating index, a Y-direction initial floating index, a Z-direction initial floating index and an initial floating angle compensation index, and the initial floating data refers to an offset distance of a plug relative to the socket that is obtained on the premise that the plug is plugged into the socket;

adjusting the first distance and the second distance to obtain first floating data of the battery swapping electrical interface again, if it is judged that the initial floating data is in a first index interval;

repeatedly inserting or pulling the plug into or out of the socket of the battery swapping electrical interface if it is judged that the first floating data is not present in the first index interval or a second index interval, wherein the first index interval is larger than the second index interval;

obtaining second floating data of the battery swapping electrical interface after repeatedly inserting or pulling the plug into or out of the socket for a preset number of times; and determining current first distance and a current second distance as optimal distances if it is judged that the second floating data is in the second index interval.

2. The method for optimizing and testing the harness layout of the battery swapping electrical interface according to claim 1, before obtaining the first distance and the second distance, further comprising the following steps:

collecting mounting parameters of the battery swapping electrical interface on an overall vehicle, wherein the mounting parameters at least comprise: a linear distance between the extension line passing through the center of the socket and an extension line passing through a center of the harness fixing piece of a chassis of the overall vehicle, and a linear distance between the extension line passing through the center of the harness fixing piece of the chassis of the overall vehicle and a top of a frame of the overall vehicle; and mounting, according to the mounting parameters, the supporting arm and the harness fixing piece in corresponding positions on the second platform.

3. The method for optimizing and testing the harness layout of the battery swapping electrical interface according to claim 1, wherein the obtaining initial floating data of the battery swapping electrical interface specifically comprises the following step:

obtaining the offset distance of the plug relative to the socket on the premise that the plug is plugged into the socket, wherein the offset distance is the initial floating data of the current battery swapping electrical interface.

4. The method for optimizing and testing the harness layout of the battery swapping electrical interface according to claim 1, wherein the adjusting the first distance and the second distance specifically comprises the following step:

individually adjusting the first distance or the second distance according to a preset step length.

* * * * *